United States Patent [19]

Swapp et al.

[11] Patent Number: 4,709,801

[45] Date of Patent: Dec. 1, 1987

[54] INPUT BUFFER AND ARTICLE INJECTOR MECHANISM FOR AN AUTOMATED ARTICLE HANDLER

[75] Inventors: Mavin C. Swapp; Milo W. Frisbie, both of Mesa, Ariz.

[73] Assignee: Motorola, Inc., Schaumburg, Ill.

[21] Appl. No.: 53,528

[22] Filed: May 22, 1987

Related U.S. Application Data

[63] Continuation of Ser. No. 815,853, Jan. 3, 1986, abandoned.

[51] Int. Cl.[4] .............................................. B65G 37/00
[52] U.S. Cl. ................................. 198/464.2; 198/572; 198/836
[58] Field of Search ...................... 198/346.1, 394, 397, 198/444, 457, 459, 460, 464.2, 465.1, 465.3, 572, 803.01, 803.02, 809, 836; 209/573; 221/163, 164, 236; 324/158 F; 414/222, 224, 403, 404, 416, 417

[56] References Cited

U.S. PATENT DOCUMENTS

| | | | |
|---|---|---|---|
| 2,124,397 | 7/1938 | Gwinn et al. | 198/457 |
| 2,439,189 | 4/1948 | Schafroth | 198/836 X |
| 3,092,237 | 6/1963 | Miller | 198/836 X |
| 3,189,220 | 6/1965 | Mullaney | 221/236 X |
| 3,701,021 | 10/1972 | Isaac et al. | 324/158 F |
| 3,856,131 | 12/1974 | Flamand et al. | 198/457 |
| 3,896,935 | 7/1975 | Hjelle et al. | 221/295 X |
| 3,899,085 | 8/1975 | Chaparro et al. | 198/345 |
| 4,128,174 | 12/1978 | Frisbie et al. | 209/573 |
| 4,164,279 | 8/1979 | Dubuit | 198/457 X |
| 4,170,290 | 10/1979 | Frisbie et al. | 198/524 |
| 4,222,166 | 9/1980 | Kurek et al. | 414/404 X |
| 4,372,710 | 2/1983 | Kasparek et al. | 198/572 X |
| 4,423,815 | 1/1984 | Boissicat | 209/573 X |
| 4,478,352 | 10/1984 | Amundson et al. | 209/573 X |
| 4,514,963 | 5/1985 | Bruno | 198/460 X |
| 4,533,043 | 8/1985 | Swain | 206/328 |

OTHER PUBLICATIONS

*Semiconductor International,* Sep. 1985, pp. 93–98, "I. C. Product Handler Trends", by Burggraaf.

*Primary Examiner*—Johnny D. Cherry
*Attorney, Agent, or Firm*—Raymond J. Warren

[57] ABSTRACT

A buffer and injector apparatus for use in an automated article handling system is adapted to operate between one process which periodically outputs a plurality of articles and another which requires a steady input of individual articles. A particular embodiment is adapted for use in an automated integrated circuit handler between a sleeve unloader and a transport apparatus. Integrated circuits are slideably contained by a buffer track and moved thereon by a belt. Neither the track nor the belt contact the leads of the integrated circuits. A sensor mid-way down the track triggers the sleeve unloader to input more integrated circuits. An injector apparatus at the output end of the track comprises a wheel which engages each integrated circuit until the transport apparatus is ready, then rotates rapidly to inject the integrated circuit into the transport and simultaneously engage another integrated circuit.

5 Claims, 23 Drawing Figures

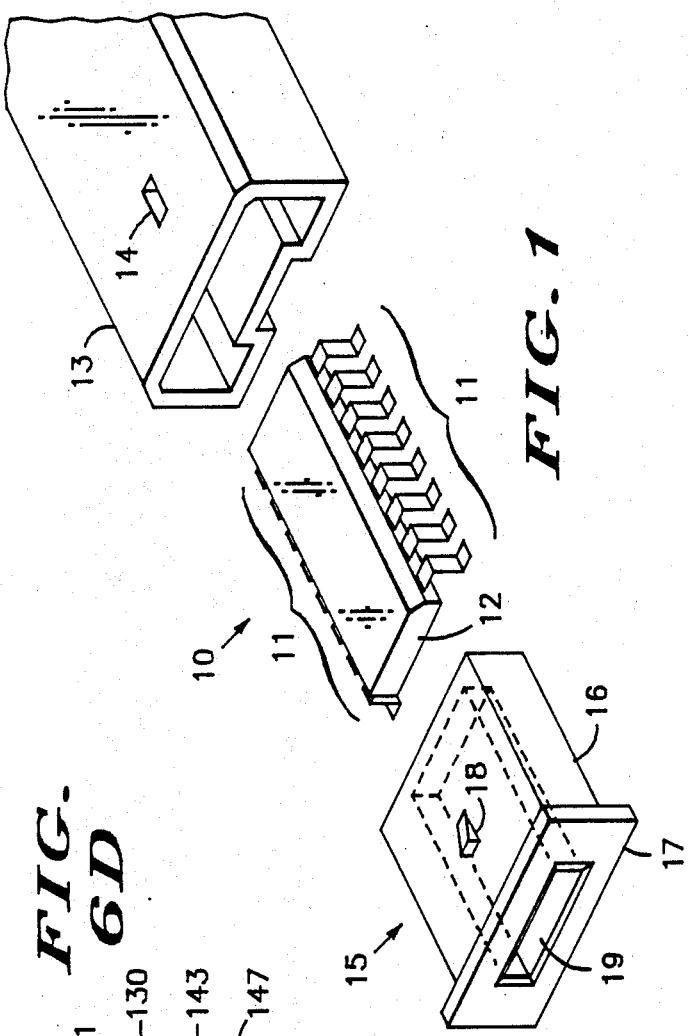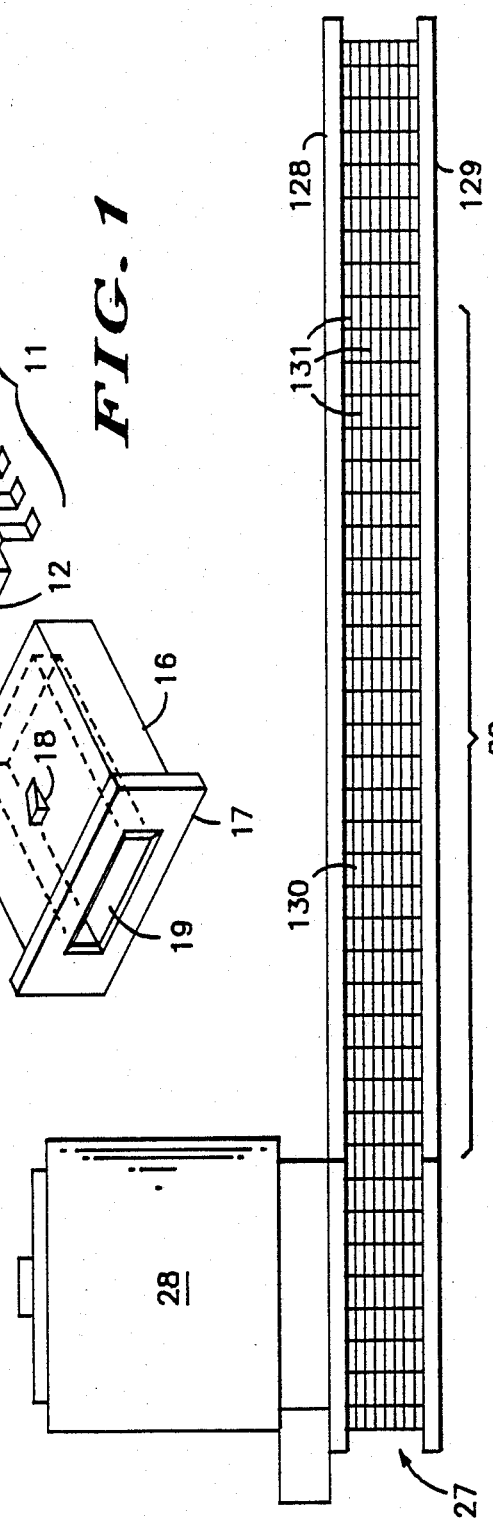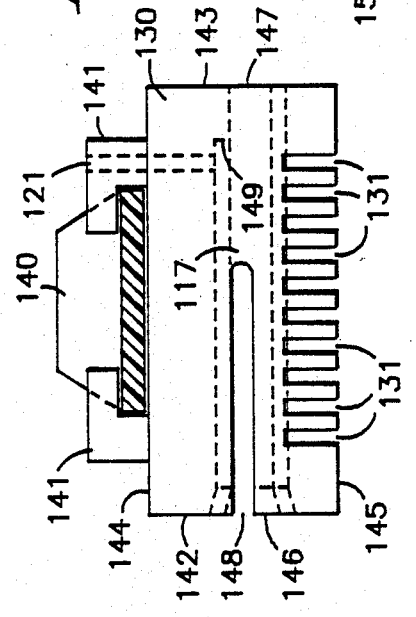

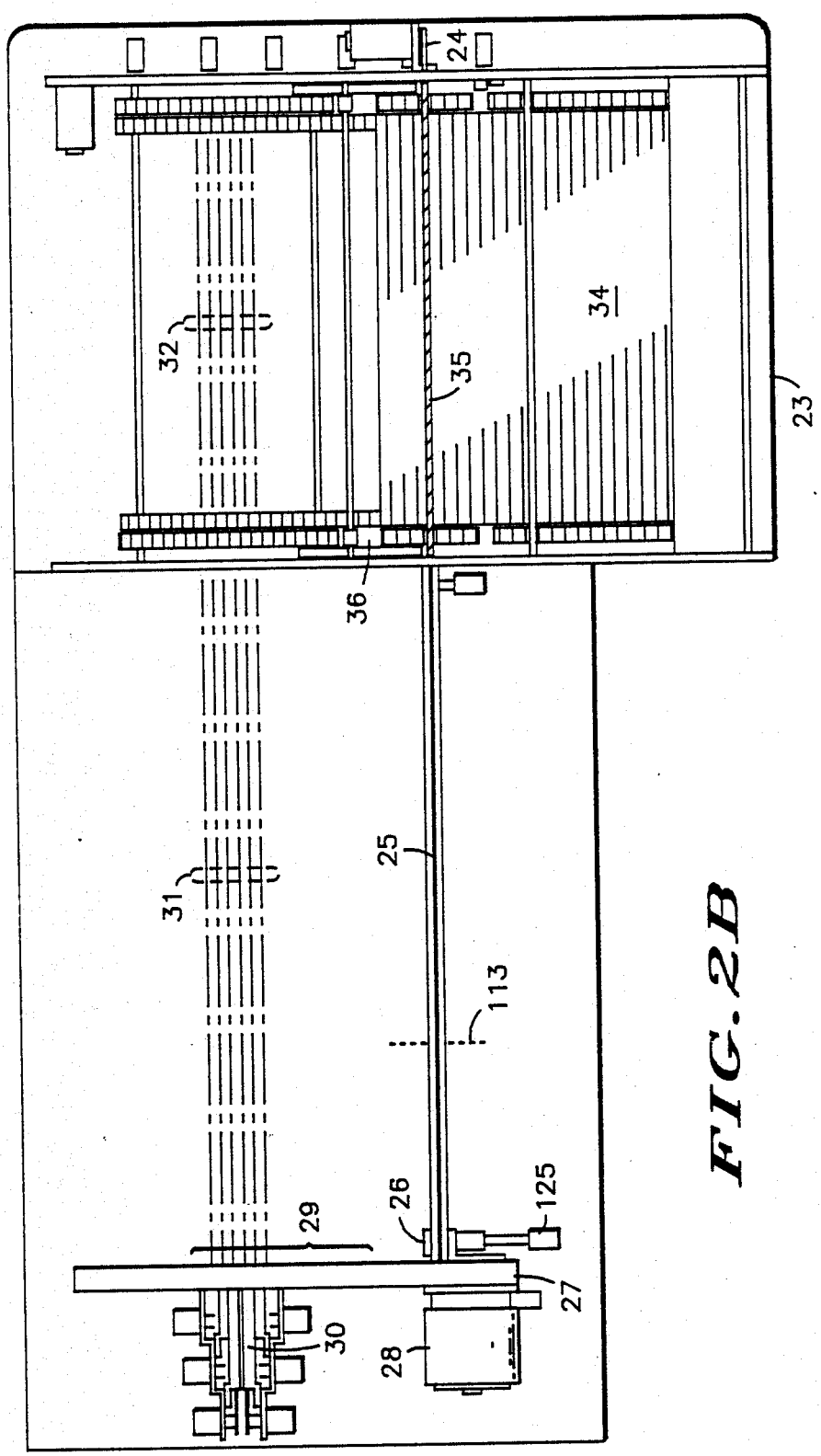

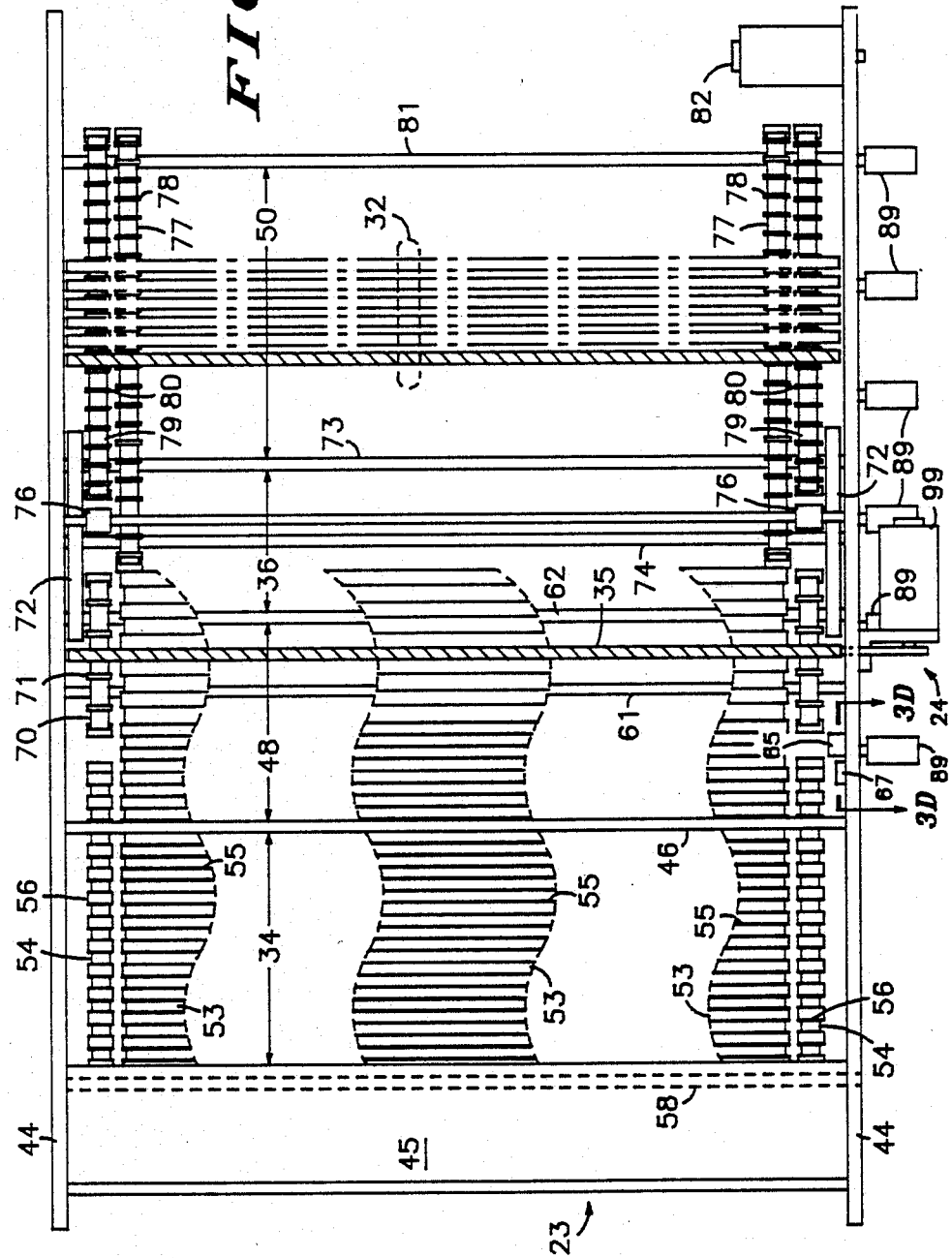

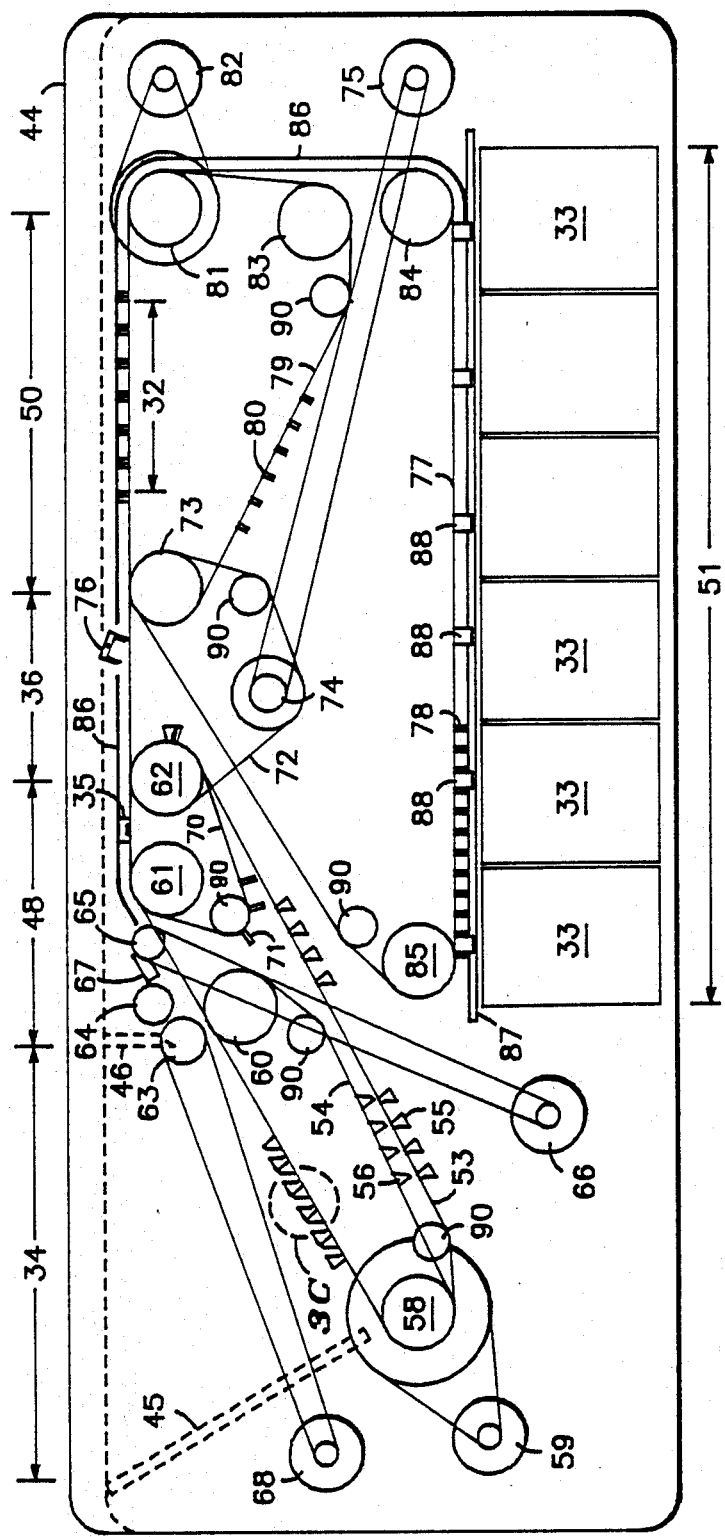
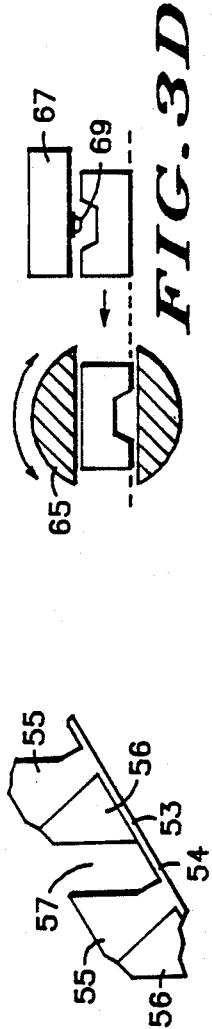
FIG. 3B
FIG. 3C
FIG. 3D

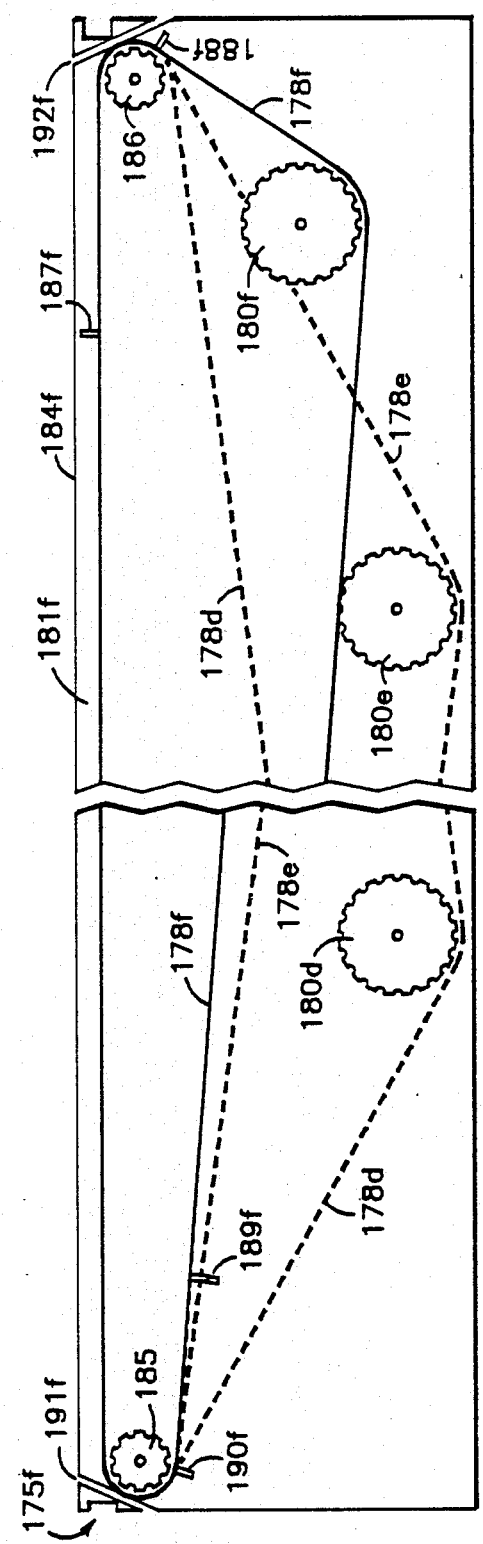
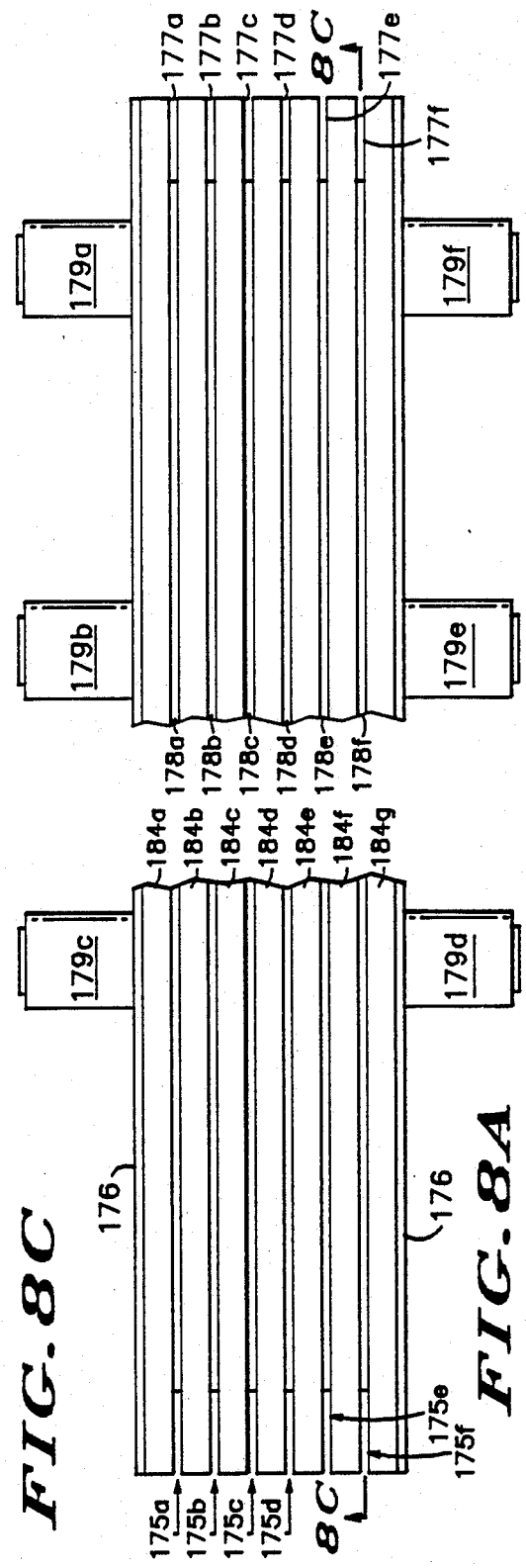
FIG. 8C
FIG. 8A

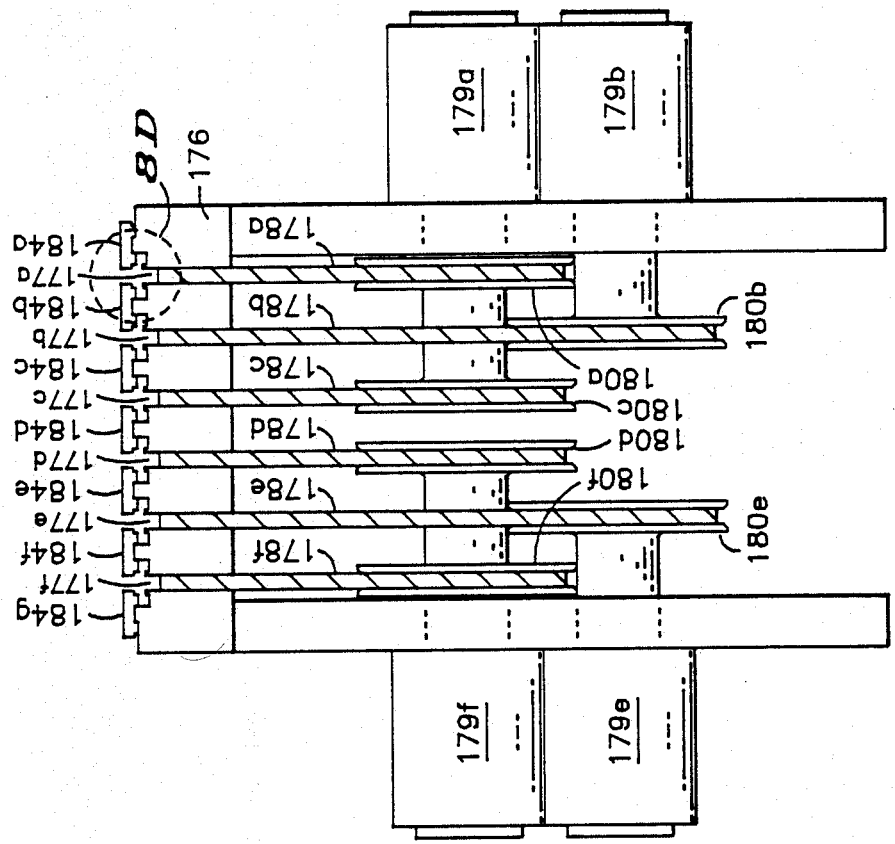
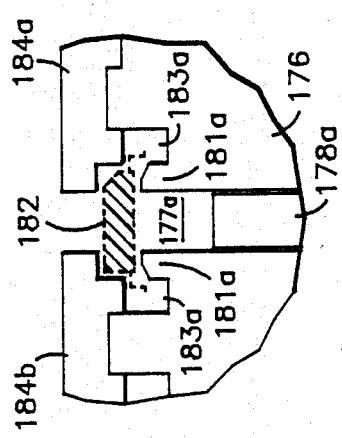
FIG. 8D
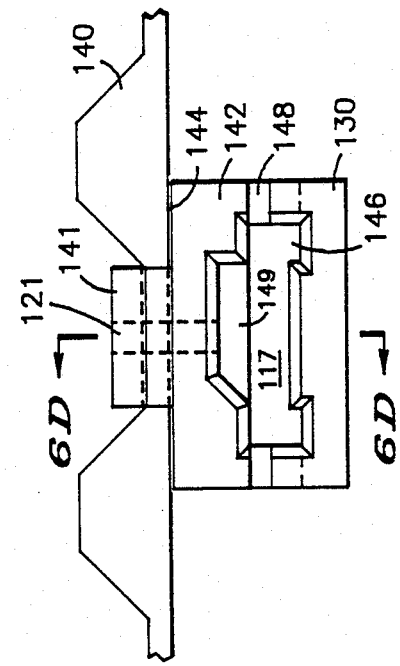
FIG. 6C

INPUT BUFFER AND ARTICLE INJECTOR MECHANISM FOR AN AUTOMATED ARTICLE HANDLER

This application is a continuation of application Ser. No. 815,853, filed Jan. 3, 1986, now abandonded.

FIELD OF THE INVENTION

The present invention relates, in general, to a buffer and article injector mechanism suitable for use in an automated article handler. More particularly, the invention relates to an input buffer and injector mechanism adapted for use in a high-throughput integrated circuit handler.

BACKGROUND OF THE INVENTION

A function commonly required in an automated article handling system is that of a buffer. More precisely, it is commonly necessary to provide a buffering function between two article handling operations which proceed at different paces.

An example of such a buffering function occurs when one article handling function produces intermittent outputs consisting of a plurality of articles while the next handling function requires a relatively steady input of single articles. Obviously, a buffering function together with a capability of inputting single parts to the second operation is required.

An automated integrated circuit handling apparatus may require the buffering and input functions described above. The basic unit of input to such an apparatus is a sleeve containing many individual integrated circuits. If the sleeve handling and unloading operations are automated, the apparatus must be capable of accepting intermittent inputs of a number of integrated circuits simultaneously. Since the testing or marking function which such an apparatus serves is oriented to single units and typically requires a steady input, a buffering and input function is necessary.

In an automated integrated circuit handling apparatus, the primary concerns are throughput, direct labor costs and reliability. The effect of even minor improvements in throughput and the amount of manual labor involved in a final test operation, for instance, can be dramatic when compared with the total manufacturing cost of each integrated circuit.

In some cases, such as surface-mountable integrated circuits, a handling apparatus must also be designed to fastidiously avoid changing the position of the metal leads of the devices. When combined with the requirement of high throughput, or rapid movement of parts from one point to another, this places rather severe constraints on the buffer apparatus.

SUMMARY OF THE INVENTION

Accordingly, it is an object of the present invention to provide an improved buffer apparatus for use in an automated article handling apparatus.

A further object of the present invention is to provide an improved article buffer/injector for use in a high throughput automated article handler.

Yet a further object of the present invention is to provide an improved buffer/injector apparatus suitable for use in a high throughput integrated circuit handler.

Still a further object of the present invention is to provide a high speed integrated circuit buffer/injector apparatus which is capable of handling surface-mountable integrated circuits without damage to the leads thereof.

These and other objects and advantages of the present invention are provided by an article buffer/injector apparatus comprising a buffer track on which articles are carried and on which the articles slide. A continuous, smooth belt provides impetus to move the articles from an input end of the track toward an injector end thereof. An injector wheel at the injector end of the track engages individual articles from the track and rapidly injects articles, one at a time, into the subsequent handling apparatus. A particular embodiment comprises an integrated circuit buffer/injector apparatus capable of throughput rates greater than approximately 60,000 parts per hour and capable of handling surface-mountable integrated circuits without lead damage.

These and other objects and advantages of the present invention will be apparent to one skilled in the art from the detailed description below taken together with the drawings.

BRIEF DESCRIPTION OF THE DRAWINGS

FIG. 1 is a perspective view illustrating a small outline integrated circuit (SOIC) part, a sleeve for holding a plurality of such parts and an end cap for such a sleeve according to one aspect of the present invention.

FIGS. 2A, 2B and 2C are front, top and end views, respectively, of a high speed integrated circuit handler according to the principles of the present invention.

FIGS. 3A, 3B, 3C, and 3D are top, side and two detail views, respectively, of an automated integrated circuit sleeve handler according to one aspect of the present invention.

FIGS. 6A, 6B, 6C and 6D are top, side and two detail views, respectively, of a continuous belt and pocket transport arrangement according to one aspect of the present invention.

FIGS. 8A, 8B, 8C and 8D are top, end, cross-sectional and detail views, respectively, of an output buffer track according to one aspect of the present invention.

DETAILED DESCRIPTION OF THE INVENTION

Figure 2A:
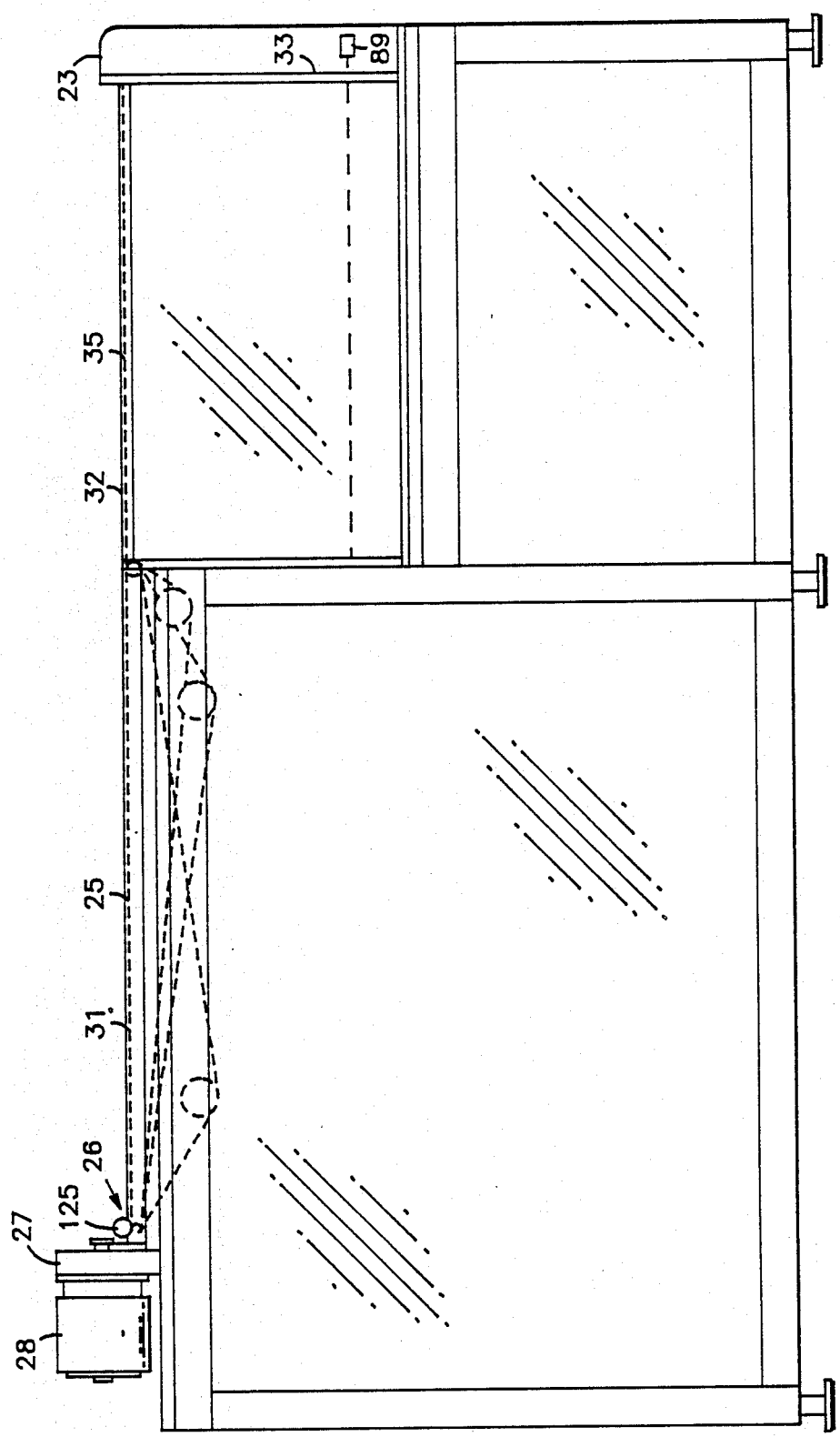

FIG. 1 illustrates, in perspective, a typical integrated circuit 10 and sleeve 13 herefore and an end cap 15 for the sleeve according to one aspect of the present invention. The ensuring description of the present invention will refer to the type of IC package illustrated here, which is referred to as a small outline integrated circuit (SOIC). Of course, many different packages exist and would be equally well suited to handling with the concepts discussed with obvious modifications thereto. Part 10 generally comprises a body 12 and a plurality of leads 11 extending therefrom. In the case of an SOIC package as illustrated, leads 11 extend below the bottom of body 12 and are formed so as to end parallel to a surface to which they will be mounted, such as a circuit board. To provide reliable, automated mounting of such components, the tolerance of the lead placements must be extremely small, which requires that no malformation of the leads occur during handling of the parts at final test.

Sleeve 13 generally comprises an elongated hollow tube of plastic having a generally A-shaped cross-section, as shown. In addition, a hole 14 in the upper surface of sleeve 13 a short distance from the end thereof acts to engage a catch on end cap 15. In the case of SOIC's, sleeve 13 is approximately 19 inches long and holds either 47 or 96 parts, depending on the number of leads, or the overall length, of each part.

End cap 15 comprises a body 16 which is dimensioned to fit within sleeve 13, an end flange 17 which fits over the end of sleeve 13, a catch 18 protruding from the upper side of body 16 which engages hole 14 in sleeve 13 to retain end cap 15 therein and a passage 19 extending through end flange 17 and body 16. Passage 19 is dimensioned to allow passage of a pusher mechanism therethrough to contact the SOIC's within sleeve 13, but not to allow the SOIC's to escape. The end of passage 19 at end flange 17 is preferrably chamfered, as shown, to ease insertion of the pusher mechanism (see FIGS. 4A and 4B). In addition to the catch arrangement shown, other arrangements, such as friction fit, may be used to secure end cap 15 within sleeve 13.

Figure 2C:
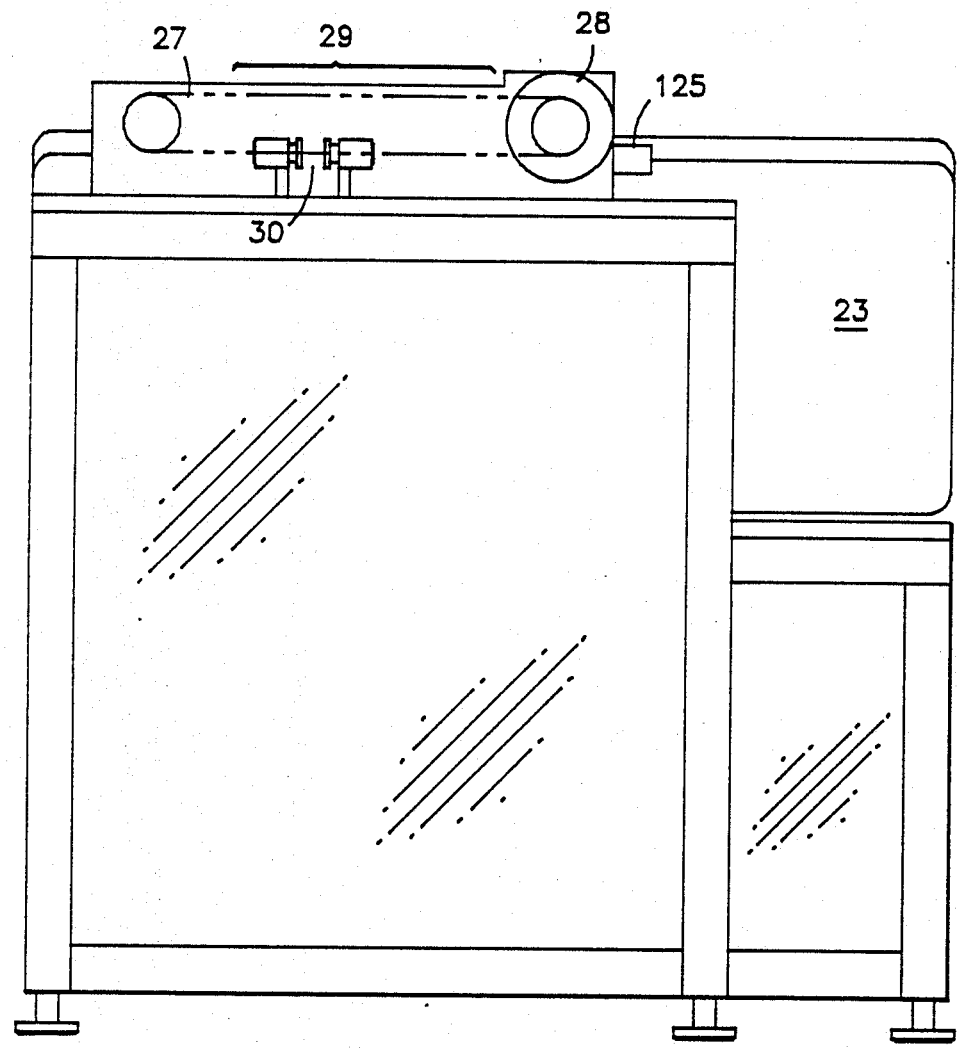

FIGS. 2A-2C illustrate, in front, top and side views, respectively, a high speed integrated circuit handler according to the principles of the present invention. Because of the complexity of the handler, some details are omitted from FIGS. 2A-2C, but are shown in later FIGS.. The major portions of the handler are an automated sleeve handler apparatus 23, a sleeve unloader apparatus 24, an input buffer track 25, a pocket loading apparatus 26, a continuous belt transport system 27 with associated drive motor 28, a test area 29, a pocket unloader mechanism 30, a plurality of output buffer tracks 31 with associated sleeve loading stations 32 in sleeve handler 23 and output bins 33.

The operation of the illustrated integrated circuit handler is begun by the manual loading of a relatively large number of sleeves containing untested parts into input hopper portion 34 of sleeve handler 23. The sleeves must all be aligned with their long axes parallel, but no further manual alignment is required. Sleeve handler 23 singulates the sleeves, uniformly orients them and presents each sleeve at a sleeve unloader station 35. Sleeve unloader 24 then operates to push the parts out of the sleeve and onto input buffer track 25. The empty sleeves are moved to buffer portion 36 of sleeve handler 23 to wait until needed at sleeve loading stations 32.

Once on input buffer track 25, the parts are moved toward pocket loader mechanism 26. Continuous belt transport system 27 carries a plurality of pockets (not shown) which are each adapted to hold exactly one part. As transport 27 is indexed to bring an empty pocket in alignment with pocket loader mechanism 26, the latter is operated to inject one part from input buffer track 25 into the empty pocket. As transport 27 is further advanced, each pocket, now carrying a part, is brought into test area 29, wherein a test head (not shown) including test leads (also not shown) makes electrical contact to the leads of the part. As contact is made, transport 27 is halted for a period of time sufficient for an external test system to perform electrical tests on the part and assign the part to one of the up to six output categories.

Transport system 27 is further advanced, with a part being tested at each stop. Eventually, each pocket reaches pocket unloader mechanism 30. When the pocket bearing a particular part is aligned with the correct one of the six output buffer tracks 31, pocket unloader mechanism 30 is operated to eject that part from the pocket onto the output buffer track. The system controlling the handler keeps a count of the number of parts which have been assigned to each output category in order that an empty sleeve in buffer portion 36 of sleeve handler may be positioned in alignment with sleeve loading stations 32 in anticipation of a particular output buffer track being full. In fact, each output buffer track is long enough to hold slightly more than one sleeve-full of parts so that parts may continue to be loaded onto a track while other parts are being unloaded therefrom into an empty sleeve.

When one of output buffer tracks 31 contains a sleeve-full of parts and an empty sleeve has been aligned with that track at sleeve loading station 32, the track is operated to slide the parts into the sleeve. During subsequent movements of sleeve handler 23, this full sleeve is eventually brought into alignment with the output bin 33 which is appropriate for the parts in that sleeve. A "trapdoor" mechanism (not shown) is then operated to drop the sleeve into the bin for manual removal by an operator.

The entire system just described is designed to provide a throughput of approximately 60,000 parts per hour, or one part every 60 milliseconds. A test time of approximately 30 milliseconds per part is assumed. Thus, the handler must be capable of indexing from one part to the next at the test head in approximately 30 milliseconds. As is apparent, this figure of merit can be carried through the entire handler to calculate the throughput rate of any portion thereof. In no case is any previously known handler capable of achieving the desired throughput rates.

As will be apparent to one skilled in the art, many details have been omitted from the functional description above. Most of these will be discussed in detail below. Some, such as the detailed structure and operation of the electrical test apparatus, are beyond the scope of the present invention.

Referring now to FIGS. 3A-3D, sleeve handler 23 is described in detail. The sides of sleeve handler 23 are defined by a pair of parallel side walls 44 which are spaced so that a sleeve just fits lengthwise between them. This is because sleeves loaded into handler 23 will have only one end cap, with the other end being open to allow removal and reloading of parts. Walls 44 serve to hold the parts in the sleeves during handling.

The structure and function of sleeve handler 23 is most easily understood as comprising five major functional units or portions. An input hopper portion 34 serves to receive a plurality of sleeves, singulate them and present partially oriented single sleeves to the next portion. An orientation and sleeve unloading portion 48 receives single, partially oriented sleeves from input hopper portion 34, uniformly orients the sleeves and presents them to an unloading station 35. After the parts are ejected from the sleeve by sleeve unloader 24, the empty sleeves are passed to an empty sleeve buffer portion 36. When the handler system controller anticipates the need for an empty sleeve at one of the six sleeve loading stations 32, an empty sleeve is passed from buffer portion 36 to a sleeve loading portion 50. Sleeve loading portion 50 presents the sleeve in alignment with the appropriate output buffer track (not shown) for loading. Subsequently, the filled sleeves are passed to a sleeve binning portion 51 for output into an appropriate bin.

Input hopper portion 34 of sleeve handler 23 comprises a first hopper wall 45 and a second hopper wall 46 which extend between sleeve handler walls 44 and define the input hopper. That is, sleeves are loaded into the handler between hopper walls 45 and 46. The bottom of the input hopper is defined by a main input belt 53 having a plurality of paddles 55 thereon and a first alignment belt 54 having a plurality of paddles 56 thereon. Both belts 53 and 54 are continuous, preferably molded belts which are carried on pulleys which, in turn, are fixed to axles extending between sleeve handler walls 44. For reasons discussed below, paddles 55 and 56 have a relatively complex cross-section and may, therefore, be somewhat expensive to acquire. It may be preferrable to mold or machine the paddles separate from the belts and affix them by means of clips or the like. Main input belt 53 is carried on pulleys fixed to a first axle 58, a second axle 60, a third axle 61 and a fourth axle 62. First alignment belt 54 is carried on pulleys fixed to first axle 58 and second axle 60. As is apparent, the relative placement of paddles 55 and 56 may be adjusted by adjustment of the appropriate pulleys on axles 58 and 60. Both main input belt 53 and first alignment belt 54 are driven by a first motor 59 which drives first axle 58.

As is most clearly apparent from FIG. 3A, main input belt 53 is actually a pair of belts with wide paddles extending therebetween. As is also apparent, alignment belt 54 is, in fact, two belts which lie between the outside edges of main input belt 53 and walls 44. Between first axle 58 and second axle 60, main input belt 53 and alignment belts 54 are substantially parallel along the bottom of the input hopper.

Referring to the detailed view of FIG. 3C, the structure and function of belt 53 and 54 are described. In the cross-section of this figure, belts 53 and 54 appear coincident. In addition, paddles 55 on belt 53 and paddles 56 on belt 54 are seen to be aligned in order to define a space 57. Space 57 is defined at its back edge by the front of a main belt paddle 55, at its bottom side by belts 53 and 54 and at its front edge by the back of an alignment belt paddle 56. The shape of space 57 thus defined is chosen so that a sleeve must be in one of two orientations about its longitudinal axis in order to fall into space 57. In both orientations, the sleeve may be described as lying on its side against belts 53 and 54. The two orientations are related by a 180 degree rotation about the longitudinal axis. In addition, space 57 is defined so that only one sleeve may reside therein. Thus, the function of belts 53 and 54 is to singulate the sleeves and to partially orient them.

As sleeves are carried toward the upper end of input hopper portion 34, belts 53 and 54 pass immediately under a pair of rollers 63 and 64. Roller 64, which is driven by a second motor 68 and extends between sleeve handler walls 44 immediately under input hopper wall 46, serves to ensure that no sleeves are carried out of the input hopper atop paddles 55 and 56 by knocking any such sleeves back into the input hopper. Roller 64, which is also driven by second motor 68 through gears attached to roller 63, extends just far enough inside sleeve handler wall 44 to engage the ends of passing sleeves and contacts sleeves in the region subsequent to second axle 60. In this region, the sleeves are no longer confined in the restrictive space 57 and may be manipulated. Roller 64 does just this by knocking the sleeves down so that they rest flat on main input belt 53 between paddles 55. Once again, there are two possible orientations which the sleeves may take which are related by a 180 degree rotation about the long axis.

By the time the sleeves have been carried past rollers 63 and 64, they have passed under input hopper wall 46 and are within orientation and unloading portion 48 of sleeve handler 23. An orientation apparatus 64 is mounted in one side wall 44 in order to engage the end of each sleeve. Orientation apparatus 65 is positioned to engage the sleeves while they are being carried only by main input belt 53, the paddles 55 of which are so spaced as to allow rotation of sleeves carried therebetween.

FIG. 3D is a detailed cross-sectional view of orientation apparatus 65 taken along the line 3D of FIG. 3A. Apparatus 65 is basically a slotted rod which is adapted to receive the end of each sleeve therein as it passes the location of apparatus 65. Immediately preceding apparatus 65 is a sensor 67 attached to handler wall 44, which determines which of the two possible orientations each sleeve is in. In the embodiment illustrated, sensor 67 comprises a switch having an acutator button 69. When a sleeve is upside-down, as illustrated, button 69 falls into the space between the legs of the "A" and switch 67 is not actuated. In the other orientation, button 69 will be depressed by the top of the sleeve and actuate switch 67. If the sleeve is in the orientation illustrated in FIG. 3D, th slotted rod is rotated 180 degrees by means of third motor 66 (FIG. 3B). Since the end of the sleeve is within the slot, this also rotates the entire sleeve. Obviously, if the sleeve is already in the proper orientation, orientation apparatus 65 is not operated. Thus, sleeves leaving the location of orientation apparatus 65 are uniformly oriented.

As the sleeves are advanced further by movement of main input belt 543, their ends are engaged by a second pair of alignment belts 70 with paddles 71. Second alignment belts 70 are carried on pulleys fixed to third axle 61 and fourth axle 62 and run between the edges of main input belt 53 and walls 44. Because the space between paddles 55 of main input belt 53 must be great enough to allow orientation of the sleeves therein, the position of those sleeves is not sufficiently precise to allow reliable positioning at unloading station 35. Therefore, paddles 71 perform the function of engaging the rear edge of each sleeve and forcing the front edge thereof against the trailing edge of a paddle 55 on main input belt 53. This action determines the position of the sleeve with sufficient accuracy to allow reliable unloading.

When each sleeve has advanced to the position indicated by reference numeral 35, which is referred to as the sleeve unloading station, unloader mechanisms 24 (not shown in FIG. 3B) is operated to push the parts out of the sleeve. A wall 86 (not shown in FIG. 3A) extends over the sleeves once they are past orientation apparatus 65 and extends to output portion 51 to improve alignment and stability of the sleeves. This is described in detail below with reference to FIGS. 4A and 4B.

As main input belt 53 and second alignment belt 70 are advanced further, each sleeve is moved past unloading station 35 until its ends are supported by a pair of buffer belts 72. Buffer belts 72 are carried by pulleys which are carried by fourth axle 62, a fifth axle 73 and a sixth axle 74. The buffer belt pulleys which are carried by fourth axle 62 and fifth axle 73 are not fixed thereto, but turn freely thereon. The buffer belt pulley which is carried by sixth axle 74 is fixed thereto. Buffer belts 72 run immediately adjacent to walls 44. Sixth pulley 74 is driven by a fourth motor 75.

Buffer belts 72, which comprise empty sleeve buffer portion 36 of sleeve handler 23, are smooth in order that empty sleeves may slide thereon. A stop mechanism 76 located near the end of buffer belts 72 which is furthest removed from unloading station 35 serves to prevent empty sleeves from exiting buffer portion 36 until they are needed at a sleeve loading station 32. In the illustrated embodiment, stop mechanism 76 comprises a simple rocker arm arrangement which operates similarly to the anchor lever of a watch escapement mechanism. Stop mechanism 76 is preferably solenoid-driven. Of course, many modifications to this arrangement are possible. As will be apparent to one skilled in the art, buffer portion 36 need not be particularly large, since the rate of use of empty sleeves will be steady after an initial period during which the handler fills with parts. In the preferred embodiment, buffer portion 36 will hold approximately 10 sleeves.

The system controller, which maintains a count of the number of parts being assigned to each of the six output categories, is able to anticipate which output buffer track 31 (FIG. 2B) will be the next to need unloading. When such a need is anticipated, stop mechanism 76 is operated to release one empty sleeve from buffer belts 72.

When an empty sleeve is so released, the motion of buffer belts 72 moves it into position to be engaged by a pair of main output belts 77 having paddles 78 and a pair of output alignment belts 79 having paddles 80. Each sleeve is held between a paddle 78 of belt 77 and a paddle 80 of belt 79. As before, the purpose of the double belt arrangement is to provide adequate alignment of the sleeves, in this case so that they are properly aligned with the output buffer tracks for loading. Main output belts 77 are carried on pulleys fixed to fifth axle 73, a seventh axle 81, a ninth axle 84 and a tenth axle 85. Seventh axle 81 is driven by a fifth motor 82. Output alignment belts 79 are carried by pulleys fixed to fifth axle 73, seventh axle 81 and an eighth axle 83.

An alternate method of operation is to maintain an empty sleeve in alignment with the first sleeve loading station (the one closest to buffer belts 72. Typically, this station would be used for binning whatever category of parts is expected to receive the most parts. This scheme would reduce the amount of time necessary to index an empty sleeve into position to be filled.

As main output belts 77 and output alignment belts 79 pass over seventh axis 81, output alignment belts 79 separate and the sleevs are held only loosely between paddles 78 of main output belt 77. At this point, wall 86, which extends between sleeve handler walls 44, retains the sleeves against main output belts 77. As main output belts 77 pass over ninth axle 84, they pass into sleeve binning portion 51 of sleeve handler 23.

Sleeve binning portion 51 comprises up to six output bins 33, a retaining ridge 87, up to six doors 88 in retaining ridge 87 and up to six door actuators 89 associated therewith. Retaining ridge 87 runs along the inside of sleeve handler wall 44 and serves to maintain the full sleeves against main output belt 77 until the sleeve is over the appropriate bin 33. At this point, the appropriate door actuator 89 is triggered to open its associated door 88 and thus drop the sleeve bin 33 for removal by the operator.

A plurality of belt tensioners 90 are appropriately distributed throughout sleeve handler 23 for maintenance of tension on the various belts therein.

Figure 4A:
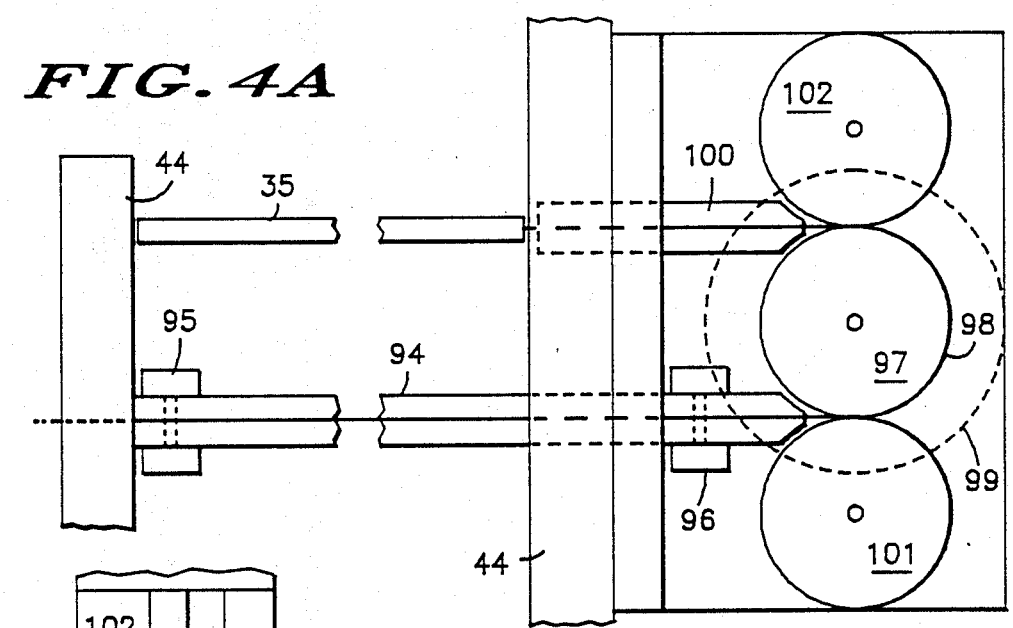
FIGS. 4A and 4B are a cross-sectional view and an end view, respectively, of a pusher mechanism according to one aspect of the present invention for use at the sleeve unloader station of the sleeve handler of FIGS. 3A–3D.
Figure 4B:
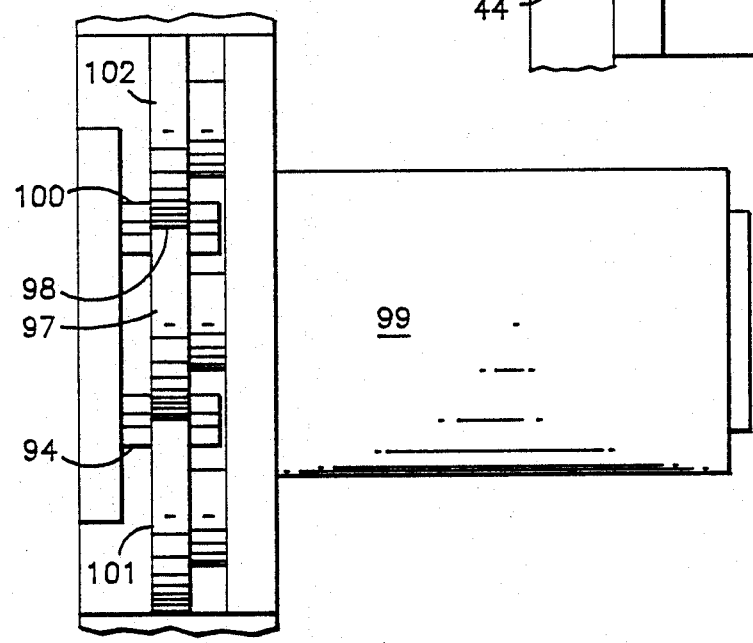

Referring now to FIGS. 4A and 4B, the structure and operation of sleeve unloader mechanism 24 is described in detail. A first tape guide 94 extends between sleeve handler walls 44 several inches below sleeve unloading station 35. First guide 94 is a hollow housing adapted to retain therein a metal tape 98. Tape 98 is preferably very similar in design and construction to the steel tape used in a household retractable tape measure. In fact, just such a tape has been used successfully. In this example, the leading end of tape 98 (the end which contacts the parts) was approximately doubled in thickness to improve the contact between the tape and the parts and to prevent the tape from "overriding" the parts.

Mounted on first guide 94 are a first tape sensor 95 and a second tape sensor 96. Each sensor is preferably a simple light source and sensor disposed on opposite sides of guide 94 so that tape 98 interrupts the light between the source and the sensor. In this manner, the position of tape 98 can be sensed.

Immediately adjacent the end of first guide 94 and outside sleeve handler wall 44 is a tape drive mechanism comprising a tape drive wheel 97, a drive motor 99 coupled thereto to rotate wheel 97, a first idler wheel 101 and a second idler wheel 102. Tape 98 passes out of first guide 94 and approximately 180 degrees around drive wheel 97. Idler wheels 101 and 102 serve to maintain tape 98 in close contact with drive wheel 97. By appropriate operation of drive motor 99, tape 98 can be very rapidly moved into and out of a sleeve positioned at sleeve unloading station 35.

In its normal, or unextended, position, tape 98 continues past drive wheel 97 and into a second guide 100, but stops just short of passing back into the space between sleeve handler walls 44. When a sleeve is properly positioned at sleeve unloading station 35, the passage in the end cap thereof (see FIG. 1) is precisely aligned with the opening of second tape guide 100. Thus, when tape 98 is advanced, it will pass through the end cap (see FIG. 1) of the sleeve at unloading station 35, make contact with the first part therein and force the parts out the other, uncapped end of the sleeve.

The normal position of tape 98 is unextended. In this position, tape 98 interrupts both sensor 95 and sensor 96. When a sleeve is in position to be unloaded, motor 99 is activated and tape 98 is moved until its trailing end first passes sensor 95 and eventually passes sensor 96. The signal from sensor 96 indicates that tape 98 is in its fully extended position and that all of the parts have been ejected from the sleeve. At this point, before the end of tape 98 leaves first guide 94, the direction of motor 99 is reversed. When the signal from sensor 95 once again indicates that tape 98 is int its unextended position, motor 99 is stopped.

As will be apparent to one skilled in the art, the basic mechanism of sleeve unloader 24 could readily be modified to serve a sleeve loading function. In other words, pusher tape 98 would push a sleeve-full of parts from a buffer track or the like into a properly aligned, empty sleeve.

The sleeve handler and unloader discussed above must be capable of presenting full sleeves and unloading them quickly in order to meet the high throughput targets required for economical operation. It is believed that, utilizing the concepts described, it is possible to unload approximately one sleeve per second. Approximately one-half second is required to push all of the parts out of the sleeve. Approximately 100 milliseconds are required to bring tape 98 back to its starting position. Approximately 400 milliseconds are required for the sleeve handler to position a new sleeve for unloading. With at least 47 parts per sleeve, this throughput rate exceeds that necessary to maintain an overall throughput rate of 60,000 parts per hour.

Figure 5A:
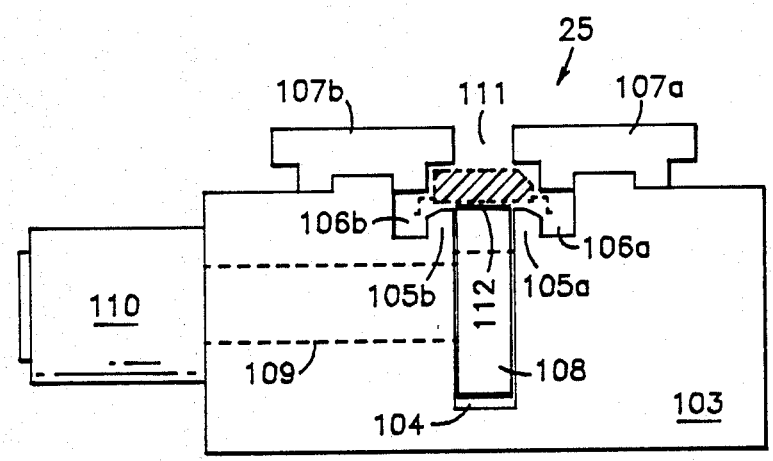
FIGS. 5A and 5B are end and cross-sectional views, respectively, of an input buffer track and pocket loader mechanism according to one aspect of the present invention.
Figure 5B:
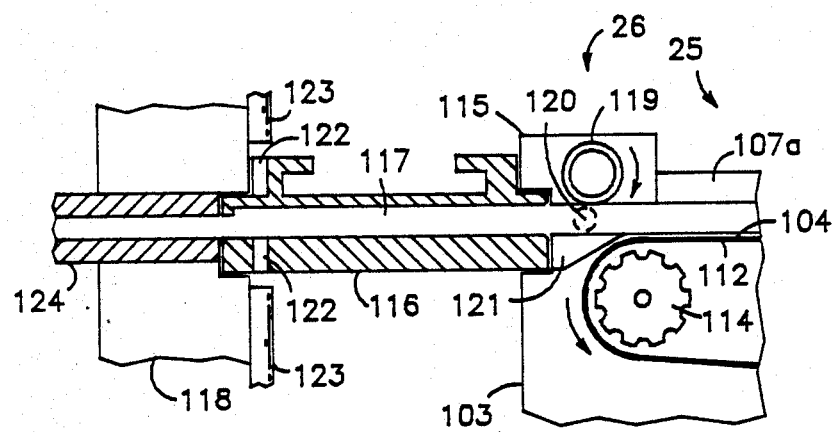

FIGS. 5A and 5B illustrate input buffer track 25. FIG. 5A is an end view of track 25 as seen from the input end; that is, the end which is aligned with sleeve unloading station 35 (FIG. 2B). A body portion 103 of track 25 comprises a central slot 104 running the length thereof, a pair of rails 105a and 105b immediately adjacent slot 104 and parallel thereto and a pair of lead spaces 106a and 106b immediately adjacent rails 105a and 105b respectively. A part (shown in phantom) may be supported on rails 105a and 105b while the leads thereof lie within lead spaces 106a and 106b. Thus, no potentially damaging contact is made with the leads.

A pair of cap members 107a and 107b are mounted to base member 103 as shown. The inner and lower edges of cap members 107a and 107b are adapted to engage the upper edges of the part and so to maintain the part in alignment down track 25. A space 111 between cap members 107a and 107b is provided to allow visual monitoring of parts within track 25 and manual adjustment of jammed parts and the like.

A pulley 108 lies within slot 104 and is carried on an axle 109 extending through body portion 103. A smooth belt 112 is carried on pulley 108 and is adjusted so as to make contact with the bottom of each part in the space between rails 105a and 105b. Belt 112 provides the motive force to propel parts down track 25. A motor 110 mounted to body portion 103 is attached to axle 109 and drives pulley 108 thereby.

Referring back, for a moment, to FIG. 2B, a sensor mounted in base portion 103 of track 25 at the location of line 113 senses when there is room in track 25 for a sleeve-full of parts. This triggers the unloading of the next sleeve at sleeve unloading station 35. The sensor may simply comprise a light source and detector disposed on opposite sides of body portion 103 so that the lack of a part therebetween provides a signal. The sensor is positioned slightly more than one sleeve length, approximately 19 inches, from the input end of track 25.

Referring now to FIG. 5B, pocket loading mechanism 26 is shown in cross-section. This is, of course, located at the output end of input buffer track 25. At this end, an idler pulley 114 carries belt 112 in slot 104 of body portion 103. Cap member 107a ends somewhat short of the end of track 25 and is replaced in function by an end cap 115. A pocket 116, which has a space 117 therein adapted to receive and hold a single part, is aligned with the end of track 25 between end cap 115 and body portion 103. As belt 112 passes over idler pulley 114, parts are removed from belt 112 and forced between a tongue portion 121 of body portion 103 and an injector wheel 119. Injector wheel 119 and tongue 121 are spaced so that a part just fits between them. Injector wheel 119 is advanced in the direction of rotation indicated by a motor 125 (see FIG. 2B) until a part occludes a light source-detector arrangement at the position indicated as 120.

Once a part is in position lodged between injector wheel 119 and tongue 121, the rotation of wheel 119 is halted until the system controller indicates that an empty pocket 116 is in position to receive the part. While injector wheel 119 is halted, parts simply back up down track 25. Normally, belt 112 is driven so as to present parts to injector wheel 119 just about as fast as they are needed. However, immediately after the loading of a new sleeve of parts onto track 25, there may be a gap between the parts. In this case, belt 112 is momentarily speeded up to close this gap.

When an empty pocket 116 is in position to receive a part, injector wheel 119 is spun rapidly in the direction indicated. This simultaneously shoots a part into pocket 116 and brings a new part into position between injector wheel 119 and tongue 121. A light source-detector arrangement 123 "looks" through a hole 122 in the back of pocket 116 to determine that the part has been successfully loaded. If the part has jammed at the mouth of pocket 116, both sensors 120 and 123 will so indicate, since the part will not clear sensor 120 and will not reach hole 122. In this case, injector wheel 119 is backed up for another try. A vacuum tube 124 extends through a wall 118 against which pocket 116 is being forced. The suction thus provided through space 117 of pocket 116 assists in locating the part completely inside pocket 116.

Figure 6B:
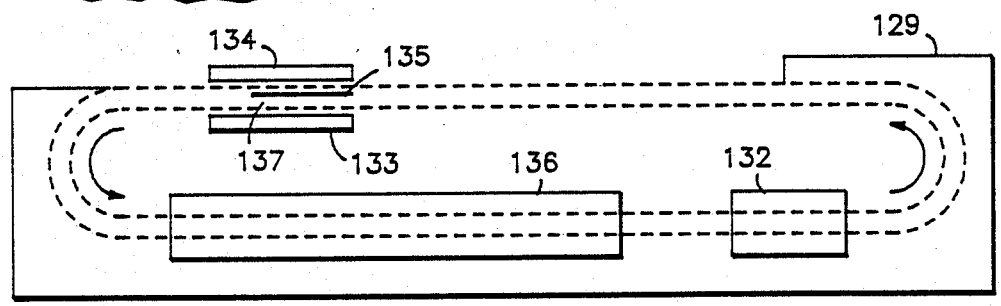

Referring now to FIGS. 6A and 6B, continuous belt transport system 27 is illustrated. FIG. 6A is a top view of system 27 with the pocket loader and unloader mechanisms removed for clarity. A first transport system wall 128 and a second transport system wall 129 provide a frame for system 27. At one end thereof, a drive motor 28 is mounted to first wall 128. Drive motor 28 is coupled to a pulley which is not visible in this view and which turns the transport belt. The belt is also not seen in this view because it is covered by a plurality of pockets 130, each of which is carrying an individual part and each of which has a plurality of slits 131 in the upper surface thereof through which electrical contact is made to the leads of the parts. Nearly all of the top surface of system 27 is available as test area 29. However, as is apparent, only a relatively small portion of test area 29 is actually utilized for this purpose. Typically, a load board containing interface circuits and the like is located in test area 29 so as to be physically and electrically very close to the actual test sight and may require significant portions of test area 29.

FIG. 6B is a side view of second transport system wall 129 as seen from a perspective between walls 128 and 129. The dotted lines indicate the path of the transport system belt and the arrows indicate its direction of motion. The outer and inner edges of the pockets are defined by the two dotted lines. A first hole 132 in wall 129 allows input buffer track 25 (see FIG. 2B) to contact the belt and pockets. A second hole 136 similarly provides access to output buffer tracks 31 (FIG. 2B). Both first hole 132 and second hole 136 are located along the lower horizontal portion of the path of the belt. Located along the upper horizontal portion of that path are a first guide member 133 and a second guide member 134. Guide members 133 and 134 engage the inner and outer edges, respectively, of each pocket as it passes a test sight 137. Guide members 133 and 134 serve to precisely determine the veritical position of each pocket so that reliable contact may be achieved to the leads of the part. Since the part also has some horizontal freedom of movement within its pocket, an alignment spring 135 positioned between guide members 133 and 134 engages the end of each part and forces it to the back of its pocket, thus precisely determining its horizontal position.

FIGS. 6C and 6D illustrate in detail the pocket/belt arrangement used in the transport system. Belt 140 is a common, molded, toothed belt of the type typically used as a timing belt or the like. A pocket 130 is attached to belt 140 by means of a pair of tabs 141 which extend around the edges of belt 140 in the space between two adjacent teeth thereof. This arrangement provides flexiblity to make changes in the design of pocket 130 and also allows the replacement of individual pockets as they wear. In some cases, in which the alignment of each pocket 130 with pocket loading mechanism 26 (FIG. 5B) is particularly critical, it may be desired to more accurately fix the position of each pocket 130 on belt 140. A "bump" molded onto belt 140 and a corresponding depression on the mating surface of pocket 130 may serve this function. In the extreme case, pocket 13 may be molded as a part of belt 140.

Pocket 130 is a custom-molded part of some complexity. Pocket 130 may be described as having an input face 142, an opposite, generally closed face 143, a back side 144 adjacent belt 140 and a contact face 145 opposite thereto. Input face 142 has an opening 146 therein which is adapted to receive a part therethrough. The edges of opening 146 are preferably chamfered, as shown. A pocket space 117 lies within pocket 130. Pocket space 117 is adapted to receive and hold a single part and and opening 146 provides ingress and egress to and from pocket space 117. A second opening 147 disposed in opposite face 143 is too small to allow ingress and egress of the part, but is useful in the pocket loading and unloading operation (see FIGS. 5B and 7B). A horizontal slot 148 extends through pocket 130 from input face 142 toward opposite face 143. Horizontal slot 148 allows alignment spring 135 (FIG. 6B) to make contact with a part in pocket space 117 and force it back against a stop 149, which prevents further movement toward opposite face 143.

A plurality of contact slots 131 are disposed on contact face 146 of pocket 130 and communicate with pocket space 117. Contact slots 131 are located so as to match the locations of the leads of a part which is at the back of pocket space 117 against stop 149. It should be noted that pocket 130 is carried on the outside surface of belt 140 (see FIG. 6B) so that, at the test station, pocket slots 131 are facing upward rather than downward as illustrated here. At least two methods of making contact with the leads of the part at the test station are possible with this arrangement. Preferably, a set of spring biased test leads ride in slots 131 and make contact with the part leads as each pocket is indexed to a position under the test station. As the belt is indexed, the test leads simply slide over part leads and pocket surfaces beneath them. An alternate method, which is more complex mechanically, is to place the test leads somewhat above the normal position of pocket 130 so that no contact is made while belt 140 is indexed. A solenoid or other means could be employed to raise each pocket 130 so as to make contact once belt 140 has stopped. Such a scheme may be most appropriate for parts with leads on all four sides.

As is apparent to one of skill in the art, the design of pocket 130 is highly dependent on the particular part for which it is designed. Therefore, the pocket design illustrated here is subject to wide variation.

Figure 7B:
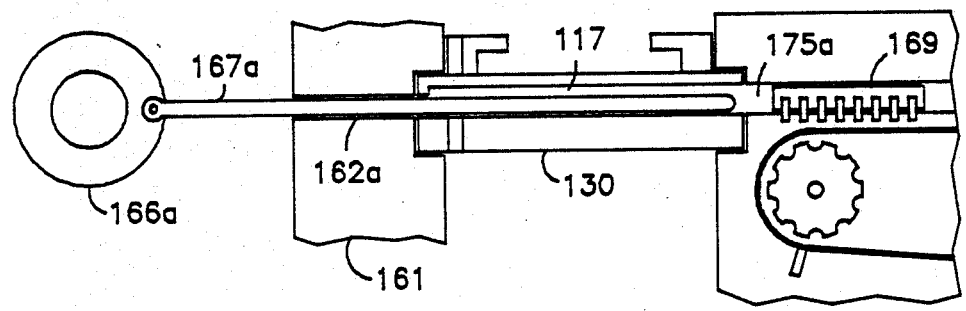
FIGS. 7A and 7B are top and cross-sectional views, respectively, of a pocket unloader mechanism according to one aspect of the present invention.
Figure 7A:
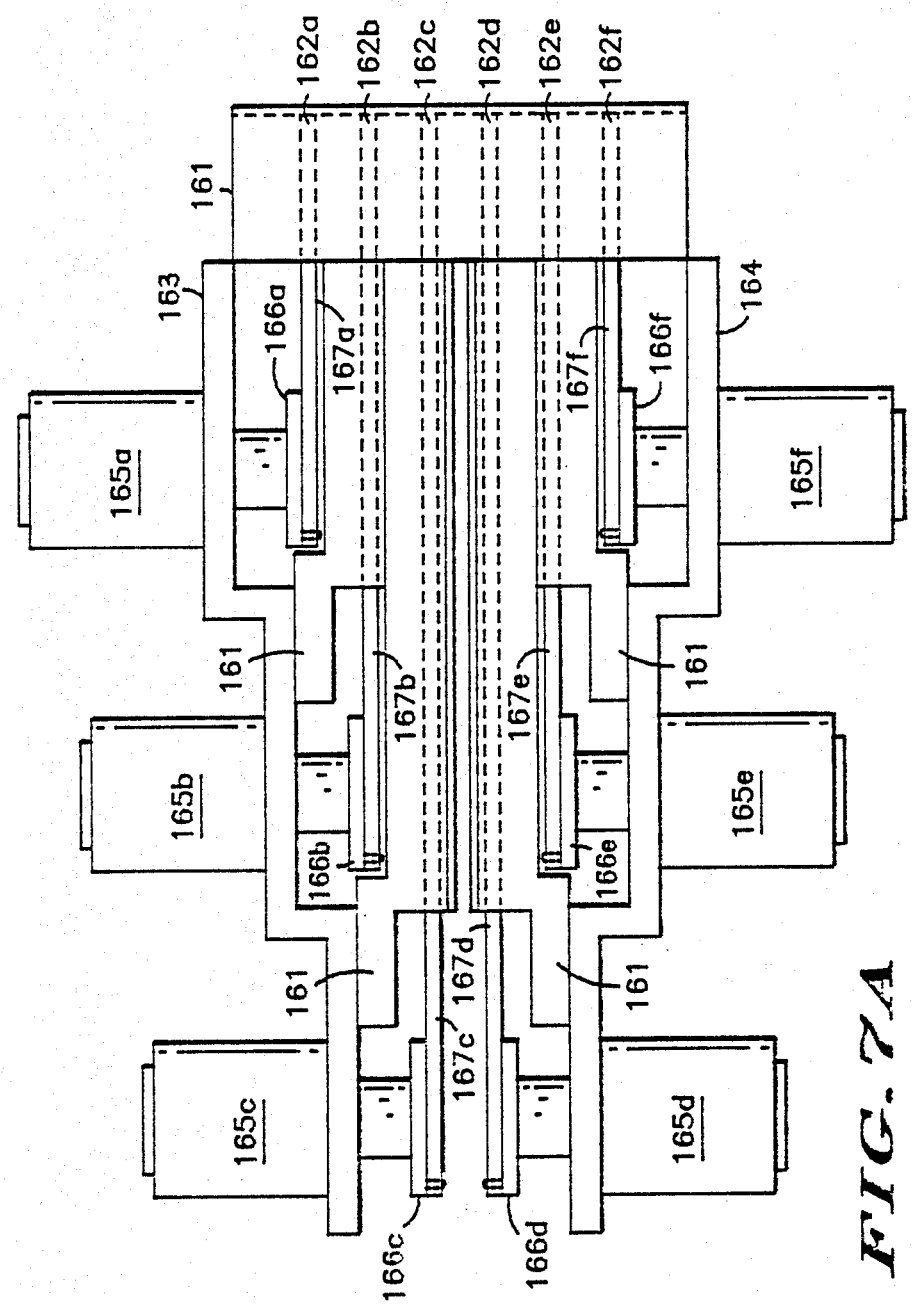

Referring now to FIGS. 7A and 7B, the structure and function of pocket unloader mechanism 30 is described. Pocket unloader mechanism 30 serves both to remove the tested parts from the pockets and to sort the parts into the six possible output categories. A guide block 161 lies immediately adjacent to the pocket-carrying transport belt (not shown) and has six guide slots 162a–162f therein. Guide slots 162a–162f are spaced one pocket-width apart. As is apparent from FIG. 7B, guide slot 162a is aligned with one of the six output buffer tracks 175a, as is the case with each of the guide slots 162b–162f and output buffer tracks 175b–175f (not shown).

A pair of frame members 163 and 164 serve as mounting means for motors 165a–165c and 165d–165f, respectively. Six disks 166a–166f are mounted on the spindles of motors 165a–165f, respectively. Six flexible push rods 167a–167f each have one end mounted eccentrically to disks 166a–166f, respectively. When motors 165a–165f are in the positions indicated in FIG. 7A, each flexible push rod 167a–167f extends through its appropriate guide slot 162a–162f, respectively, just to the outer edge of guide block 161.

When the handler is running at a rate of 60,000 parts per hour, pocket unloader mechanism 30 must be capable of ejecting a part and returning to its home position in approximately 30 milliseconds; that is, the time during which transport apparatus 27 is stopped. This speed may only be achieved with the extremely low mass mechanism described. The use of a flexible push rod made of nylon or a similar material eccentrically mounted to a disk rotated by a DC servomotor eliminates much mechanical complexity and, therefore, mass.

FIG. 7B illustrates the unloading action. When a pocket 130 carrying a part 169 has been properly positioned in alignment with the appropriate output buffer track, in this case track 175a, motor 165a is rotated 180 degrees, thus rotating disk 166a and forcing flexible push rod 167a through guide block 161. Push rod 167a enters pocket 130, contacts part 169 and forces it out of pocket 130 and onto track 175a, as shown. The unloading action is then completed by rotating motor 165a by 180 degrees again, thus placing the entire apparatus back into its rest position and allowing the advancement of the pocket-carrying transport belt into its next position.

Referring now to FIGS. 8A–8D, the output buffer track system is explained in detail. In the preferred embodiment, six output buffer tracks 175a–175f are provided, thus providing six possible output categories into which the tester may place the parts. A body portion 176 forms the base for each of the six tracks 175a–175f. Six slots 177a–177f in body portion 176 run the length thereof, are parallel to one another and are located on the same center lines as are tracks 175a–175f. Six belts 178a–178f run in slots 177a–177f, respectively.

Six motors 179a–179f are mounted to body portion 176 along the edges thereof and drive six drive pulleys 180a–180f, respectively. Belts 178a–178f are driven by drive pulleys 180a–180f, respectively.

The detailed construction of tracks 175a–175f is described with reference to FIG. 8D, which is an enlarged end view of the indicated portion of FIG. 8B. As will be apparent, each output buffer track 175a–175f is identical in construction to input buffer track 25. Immediately adjacent slot 177a and running parallel thereto are a pair of rails 181a. Rails 181a are spaced so as to engage a part 182 (shown in phantom) along the bottom surface thereof without engaging the contacts, or leads, thereof. Immediately adjacent rails 181a and running parallel thereto are a pair of lead spaces 183a. The leads of part 182 are within lead spaces 183a, thus reducing the possibility of damage thereto. This aspect is particularly important in the case of surface mount packages such as the SOIC package illustrated here, because the tolerance which must be maintained on lead placements is quite severe.

Seven cap members 184a–184g are mounted to body portion 176 intermediate between slots 177a–177f and adjacent the outside edges of slots 177a and 177f. As shown in FIG. 8D, cap members 184a and 184b engage the upper edges of the body of part 182 and act to maintain the alignment of part 182 on rails 181a. Spaces are left between cap members 184a–184g so that parts can be visually inspected in the various output tracks, jammed parts can be freed and the overall operation of the output buffer track system can be monitored.

As is apparent from FIGS. 8B and 8D, belts 178a–178f do not actually make contact with parts which are supported on rails, such as rails 181a. This is the only major difference between the input and output buffer tracks and is readily achieved by adjusting the height of the pulleys relative to the slots. The normal motive force which propels parts down tracks 175a–175f is supplied by flexible push rods 167 (FIGS. 7A and 7B) of the pocket unloader mechanism. Rails, such as rails 181a, and cap members 184a–184g are dimensioned so as to allow parts to freely slide down the tracks formed thereby. FIG. 8C illustrates the means used to control the movement of parts along track 175f. The same structure and function are present in each of the other tracks. In order to minimize confusion, only those details associated with track 175f are shown in FIG. 8C, with foreground and background matter eliminated.

Belt 178f is carried by drive pulley 180f, by an idler pully 185 at the input end of track 175f and by a second idler pulley 186 at the output end of track 175f. Belt 178f also has first, second, third and fourth paddles thereon 187f, 188f, 189f and 190f, respectively. Each paddle is long enough to extend up from belt 178f into the space between cap members 184f and 184g, thus making contact with any part which is in track 175f. While parts are being loaded, but before track 175f contains a sleeve-full of parts, belt 178f is in the position indicated in FIG. 8C. That is, first paddle 187f is within the track near the output end thereof and acts as a barrier to limit movement of parts being loaded further down the track. Second paddle 188f, third paddle 189f and fourth paddle 190f are all outside of the track area when belt 178f is in this position and do not engage any parts.

When one sleeve-full of parts is in track 175f, belt 178f is advanced until both fourth paddle 190f and third paddle 189f have passed over first idler wheel 185 and are within the track area. This also advances first paddle 187f until it is just out of the track area. In this position, the sleeve full of parts, now being pushed from behind by fourth paddle 190f, can be held until an empty sleeve is aligned with the output end of track 175f for loading. In addition, newly unloaded parts can be loaded onto track 175f and will be prevented from further movement down the track by third paddle 189f, thus keeping the two groups of parts separate.

In order to prevent accidental ejection of parts from the output end of track 175f without an empty sleeve being present, it is intended that the above-described belt movement not be carried out until a sleeve is in position. Alternatively, some low-friction means could be inserted at or near the output end of the tracks to prevent ejection of parts therefrom until they are forced out by a paddle. To load an empty sleeve with parts, belt 178f is advanced rapidly. Fourth paddle 190f forces the parts off of the output end of track 175f and into the empty sleeve. This motion is continued until fourth paddle 190f has just passed out of the track area and is in the position of second paddle 188f in FIG. 8C. Third paddle 189f is in the position of first paddle 187f, second paddle 188f is in the position of fourth paddle 190f and first paddle 187f is in the position of third paddle 189f. As is apparent, this position is equivalent to that of FIG. 8C and loading of tested parts behind third paddle 189f can proceed.

A pair of passages 191f and 192f are disposed at the input end and output end, respectively of track 175f. Similar passages are provided for each of the other output buffer tracks, but are not shown. Passages 191f and 192f are provided to allow the monitoring of track operation by means of light source-detectors pairs placed at opposite ends thereof. At the input end, a part which has jammed partially inside track 175f can be detected by occlusion of the photocell. At the output end, a part jammed partially inside the sleeve being loaded can be detected. In addition, passage 192f at the output end is used to "home" belt 178f at the start of operations. Belt 178f is rotated and paddles 187f, 188f, 189f and 190f occlude the photocell as they pass around pulley 186. When either paddle 188f or paddle 190f has just cleared passage 192f, belt 178f is stopped and considered to be in a "home" position.

Figure 9:
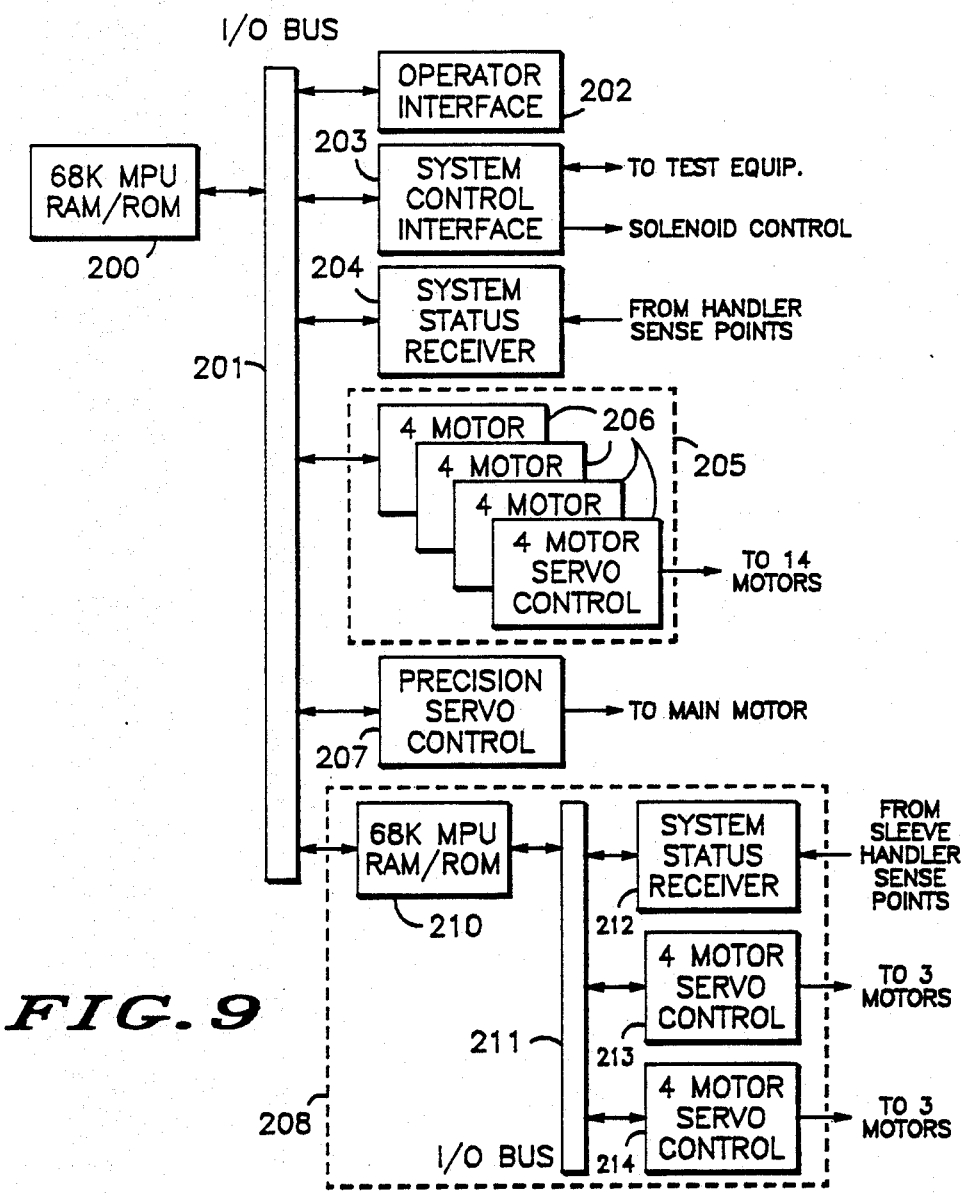
FIG. 9 is a schematic diagram of an electrical control structure of the high speed integrated circuit handler according to the principles of the present invention.

Referring now to FIG. 9, the electronic control structure of the handler described above is shown. As is apparent, the control structure is microprocessor-based. A primary microprocessor 200 (which includes associated random access and read-only memory) performs the basic control tasks. Primary MPU 200 receives indications of current system status, demands for new parts at the test station, indications of the output category for each tested part and other inputs and produces commands for the various servomotor and solenoid drivers, status outputs to the tester and other outputs.

A primary I/O bus 201 is coupled to primary microprocessor 200 and performs the familiar functions of communicating addresses, commands and data among the various devices coupled thereto. In the preferred embodiment, primary microprocessor 200 is one of the 68000 family of microprocessors available from Motorola, Inc. in Austin, Tex. The choice of microprocessor 200 will largely determine the architecture of bus 201.

An operator interface 202 is coupled to primary I/O bus 201. Operator interface 202 serves to receive commands from the operator via a control panel and to provide system status and function indicators to the operator, also via the control panel. Examples of typical commands are commands to start or stop handler operation and to unload a partially full output buffer track after all parts in a batch have been tested. Examples of typical status indicators are a warning of a jammed buffer track or of a malfunctioning sensor or motor.

A system control interface 203 is also coupled to primary I/O bus 201. The primary function of system control interface 203 is to provide an interface between primary microprocessor 200 and the test equipment which actually performs the electrical measurements on each part. This interface allows the tester to indicate its readiness to test the next part and to indicate the output category for each part, among other functions. In addition, any solenoids which are a part of the handler system are controlled through system control interface 203.

A system status receiver 204 is also coupled to primary I/O bus 201. System status receiver 204 receives inputs from each of the sense points throughout the handler. Examples are the sensor associated with the input buffer track which indicates that the buffer has room for a sleeve-full of parts and the sensor associated with the transport system which indicates that a part has been successfully injected into its pocket. System status receiver 204 provides these status indicators in appropriate form to I/O bus 201 for action by primary microprocessor 200.

Also coupled to primary I/O bus 201 is a servomotor control subsystem 205. Servomotor control subsystem 205 comprises a plurality of servomotor control boards 206. Each servomotor control board 206 is a microprocessor-based high-speed servomotor controller capable of controlling the position of a predetermined number of servomotor according to an on-line adaptive closed-loop control algorithm. An example of such an algorithm is disclosed in co-pending patent application Ser. No. 670,253, filed Nov. 9, 1984, now U.S. Pat. No. 4,609,855 and assigned to the assignee of the present invention. In the preferred embodiment, each servomotor control board 206 is capable of controlling up to four servomotors. Since there are a total of 14 servomotors in the handler exclusive of the sleeve handler and the main transport belt motor (one to drive the input buffer track, one to drive the pocket loading mechanism, six to drive the pocket unloading mechanism and six to drive the output buffer tracks), four servomotor control boards 206 are utilized. In addition to receiving position commands from primary microprocessor 200, servomotor control boards 206 provide position indications for each of the 14 servomotors to primary microprocessor 200 via I/O bus 201.

A precision servomotor control board 207 is coupled to I/O bus 201 and is dedicated to controlling the position of the main transport system motor. This motor requires dedicated control because it is a heavier-duty motor, it is running a larger percentage of the time and it requires particularly precise positioning to align the pocket with the test station leads. Again, in addition to positioning the main drive motor, controller board 207 provides position indicators to primary microprocessor 200.

A sleeve handler subsystem 208 is coupled to I/O bus 201. Sleeve handler subsystem 208 provides all necessary control and command processing for the sleeve handler portion of the handler. This subsystem is modular to allow flexibility in the sleeve handler design independent of the primary system control structure. Sleeve handler subsystem 208 comprises a subsystem microprocessor 210 with associated random access and read-only memory, a subsystem I/O bus 211, a subsystem status receiver 212, and two servomotor control boards 213 and 214.

The structure and function of each of the elements of sleeve handler subsystem 208 is substantially identical to those of the corresponding elements of the greater control system. Subsystem status receiver 212 receives status inputs from the various sensors within the sleeve handler and provides status indicators to subsystem I/O bus 211. Servomotor control boards 213 and 214 are identical to boards 206 and drive the six motors which comprise the sleeve handler (three belt drive motors, the orientation motor, the input hopper roller drive motor and the sleeve unloader motor).

An improved, high-speed integrated circuit handler has been shown and described. The disclosed handler is not gravity-driven in any of its many parts and thus avoids the several limitations of such handlers. The disclosed handler requires very minimal manual sleeve handling and thus reduces the direct labor component of handling costs. The handler is capable of at least 60,000 parts per hour throughput with a test time of 30 milliseconds per part. This throughput rate is much higher than any known prior art integrated circuit handler.

We claim:

1. A method of transporting a plurality of integrated circuits, each having a body and leads, along a transporting apparatus from an integrated circuit sleeve handler to a work area comprising the steps of:
   presenting an integrated circuit sleeve to an input of a guide means of said transporting apparatus;
   inserting said integrated circuits into said guide means, said integrated circuits being disposed in said guide means such that said guide means contacts a base of said integrated circuits;
   aligning said integrated circuits in said guide means such that said leads of said integrated circuits do not contact said guide means;
   transporting said integrated circuits from said input to an output of said guide means;
   loading one of said integrated circuits into an injector means; and
   injecting said one of said integrated circuits into said work area.

2. An apparatus for use in handling a plurality of integrated circuits, said integrated circuits each comprising a body and leads extending from said body, said apparatus comprising:
   guide means for guiding a plurality of said integrated circuits from an input end to an output end thereof, said guide means contacting a base of said integrated circuits;
   alignment means for aligning said integrated circuits such that said guide means and said alignment means do not come in contact with said leads of said integrated circuits;
   motive means for moving said integrated circuits along said guide means from said input end to said output end;
   injector means for removing one of said plurality of integrated circuits from said output end;
   first sensing means for sensing when said integrated circuit is in a position between said guide means and a plurality of work areas;
   control means for controlling said injector means such that when an empty one of said plurality of work areas is positioned for receiving said integrated circuit, said control means will operate said injector means to inject said integrated circuit into said empty work area; and
   second sensing means for sensing when said integrated circuit is in said work area.

3. The apparatus of claim 2 wherein said motive means consists of a belt conveyor.

4. The apparatus of claim 2 wherein said injector means consists of a wheel in contact with an upper surface of said integrated circuit such that rotation of said wheel causes either removal of said integrated circuit from said guide means or injection of said integrated circuit into said empty work area.

5. The apparatus of claim 2 wherein said control means further stops operation of said apparatus if said injector means injects said integrated circuit into said empty work area and said second sensing means does not sense said integrated circuit.

* * * * *